US010214826B2

(12) United States Patent
Zhou et al.

(10) Patent No.: US 10,214,826 B2
(45) Date of Patent: *Feb. 26, 2019

(54) LOW COPPER ELECTROPLATING SOLUTIONS FOR FILL AND DEFECT CONTROL

(71) Applicant: Novellus Systems, Inc., Fremont, CA (US)

(72) Inventors: Jian Zhou, West Linn, OR (US); Jon Reid, Sherwood, OR (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/753,333

(22) Filed: Jan. 29, 2013

(65) Prior Publication Data

US 2014/0209476 A1 Jul. 31, 2014

(51) Int. Cl.
| | |
|---|---|
| *C25D 3/38* | (2006.01) |
| *C25D 7/12* | (2006.01) |
| *C25D 5/10* | (2006.01) |
| *C25D 5/48* | (2006.01) |
| *H01L 21/288* | (2006.01) |
| *H01L 21/768* | (2006.01) |
| *C25D 17/00* | (2006.01) |
| *C25D 21/12* | (2006.01) |

(52) U.S. Cl.
CPC ............. *C25D 7/123* (2013.01); *C25D 3/38* (2013.01); *C25D 5/10* (2013.01); *C25D 5/48* (2013.01); *H01L 21/2885* (2013.01); *H01L 21/76877* (2013.01); *C25D 17/001* (2013.01); *C25D 21/12* (2013.01)

(58) Field of Classification Search
CPC ........................................................ C25D 7/12
USPC .................................................. 205/123, 136
See application file for complete search history.

(56) References Cited

U.S. PATENT DOCUMENTS

| | | | |
|---|---|---|---|
| 6,140,241 A | 10/2000 | Shue et al. | |
| 6,444,110 B2 * | 9/2002 | Barstad et al. | ............... 205/123 |
| 6,551,483 B1 | 4/2003 | Mayer et al. | |
| 6,551,487 B1 | 4/2003 | Reid et al. | |

(Continued)

FOREIGN PATENT DOCUMENTS

| | | |
|---|---|---|
| TW | 2008/33879 A | 8/2008 |
| WO | WO 2008/029376 | 3/2008 |

OTHER PUBLICATIONS

Long et al. (2006) "Electrochemical Characterization of Adsorption-Desorption of the Cuprous-Suppressor-Chloride Complex during Electrodeposition of Copper," Journal of the Electrochemical Society, 153(4):C258-C264 [Downloaded on Dec. 4, 2012].

(Continued)

*Primary Examiner* — Stefanie S Wittenberg
(74) *Attorney, Agent, or Firm* — Weaver Austin Villeneuve & Sampson LLP

(57) ABSTRACT

Certain embodiments herein relate to a method of electroplating copper into damascene features using a low copper concentration electrolyte having less than about 10 g/L copper ions and about 2-15 g/L acid. Using the low copper electrolyte produces a relatively high overpotential on the plating substrate surface, allowing for a slow plating process with few fill defects. The low copper electrolyte may have a relatively high cloud point.

15 Claims, 9 Drawing Sheets

(56) References Cited

U.S. PATENT DOCUMENTS

| | | | |
|---|---|---|---|
| 7,232,513 B1* | 6/2007 | Webb et al. | 205/298 |
| 8,268,155 B1 | 9/2012 | Zhou et al. | |
| 2001/0047943 A1 | 12/2001 | Barstad et al. | |
| 2002/0011415 A1* | 1/2002 | Hey et al. | 205/104 |
| 2004/0245107 A1 | 12/2004 | Che et al. | |
| 2006/0266655 A1* | 11/2006 | Sun | C25D 3/38 |
| | | | 205/102 |
| 2007/0178697 A1* | 8/2007 | Paneccasio, Jr. | C25D 3/38 |
| | | | 438/687 |
| 2009/0139870 A1* | 6/2009 | Nagai et al. | 205/131 |
| 2010/0012500 A1* | 1/2010 | Lachowicz | C09D 5/24 |
| | | | 205/183 |
| 2010/0126872 A1 | 5/2010 | Paneccasio, Jr. et al. | |
| 2012/0097547 A1* | 4/2012 | Vereecken et al. | 205/157 |
| 2012/0152749 A1 | 6/2012 | Yasuda et al. | |
| 2012/0211369 A1* | 8/2012 | Park et al. | 205/118 |
| 2016/0102416 A1 | 4/2016 | Zhou et al. | |

OTHER PUBLICATIONS

U.S. Office Action dated Jul. 14, 2017 issued in U.S. Appl. No. 14/968,662.
U.S. Final Office Action dated Feb. 12, 2018 issued in U.S. Appl. No. 14/968,662.
Taiwanese Second Office Action dated Mar. 22, 2018 issued in Application No. TW 103103593.
First Office Action dated [English Summary] dated Dec. 6, 2017 issued in Taiwanese Patent Application No. 103103593.
U.S. Office Action dated Jun. 26, 2018 issued in U.S. Appl. No. 14/968,662.

* cited by examiner

| Current | 0.1 μm trenches |
|---|---|
| 1A |  |
| 2A |  |
| 3A |  |
| 4A |  |

LOW COPPER ELECTROPLATING SOLUTIONS FOR FILL AND DEFECT CONTROL

FIELD OF THE INVENTION

The present disclosure relates generally to copper electroplating of damascene interconnects, and more specifically, to a low-copper, low acid electrolyte and a method for using the electrolyte under conditions that enhance suppression of copper plating to promote void-free fill of submicron damascene features.

BACKGROUND

Electrolytes used in electroplating copper into damascene interconnects typically contain a copper salt, an acid, halide ions, an accelerator, a suppressor and a leveler. The copper salt is the copper source for the deposition. Acid is generally used to control the conductivity of the plating bath. Halide ions may act as bridges to assist the adsorption of certain organic additives (e.g., accelerator, suppressor and/or leveler) onto a substrate surface to encourage a bottom-up fill mechanism, described herein.

Example copper salts include, but are not limited to, copper sulfate, copper methanesulfonate, copper pyrophosphate, copper propanesulfonate, etc. As used herein, the concentration of copper ions reflects the concentration (mass per volume) of copper cations, and does not include the mass of any anions associated with the copper cations. Example acids include, but are not limited to, sulfuric acid and methanesulfonic acid. As used herein, the concentration of acid reflects the concentration (mass per volume) of the entire acid molecule, not the mass of hydrogen cations alone. Example halide ions include, but are not limited to, chloride, bromide, iodide, and combinations thereof.

It may be desirable to strongly polarize the substrate in the cathodic direction, particularly during the initial stages of electroplating onto a seed layer. Such polarization may protect the seed layer from dissolution. One way to achieve such polarization is by providing a strong "suppressor" in the electrolyte.

FIG. 2 shows a copper wafer 201 plated in an electrolyte containing a strong suppressor. It is a high molecular weight suppressor with high ratio of hydrophobic propylene oxide versus hydrophilic ethylene oxide The cloud point of the electrolyte is 27° C., and plating occurred at 21° C. The plated wafer contains visible streaks caused by non-uniform suppressor adsorption on the wafer due to suppressor agglomeration. The use of some electrolytes may result in more subtle forms of such defects that are not detectable by visual inspection, but which are detectable through common defect metrology such as the AIT, SP1, or SP2 series of tools from KLA-Tencor of San Jose, Calif.

Another technique for increasing the polarization of a substrate is to increase halide ion concentrations or change the halide ion composition. This technique is further described in U.S. Pat. No. 8,268,155, incorporated by reference herein. The halide may affect the suppressing effect of a suppressor or other additive. However, the increase in overpotential that may be gained by changing halide ion concentration or composition is limited, and may not sufficient to provide the conditions needed for a uniform, reproducible fill of small 10-20 nm features. Further, the concentration of halide ions should be relatively low in the electrolyte in order to avoid incorporation of the halides into the plated films or the formation of center voids due to insufficient bottom-up fill by over-suppression of copper deposition.

While conventional electroplating solutions have worked well for previous generations of damascene interconnect fabrication processes, new challenges are emerging as smaller features and thinner seed layers are used. Thus, it has recently been found that there exists a need for a method of electroplating damascene interconnects that better protects the seed layer from dissolution and allows the deposition to occur over a longer timeframe to achieve a more reproducible, more uniform fill of features.

SUMMARY

Certain embodiments herein relate to a method of electroplating copper into damascene features using a low copper concentration electrolyte having less than about 10 g/L copper ions and about 2-15 g/L acid, and plating at a current density of about 3 mA/cm$^2$ or less. Using the low copper electrolyte produces a relatively high overpotential on the plating substrate surface, allowing for a slow plating process with few fill defects. Suppressor polymers in the low copper electrolyte may have a relatively high cloud point.

In one aspect, the embodiments herein provide a method of electroplating copper into damascene features, including receiving a substrate with a seed thickness of about 200 nm or less, on average; electrically biasing the substrate; immersing the substrate in an aqueous low copper acid-containing electrolyte having at least one suppressor compound and less than about 10 g/L copper ions, such that the low copper electrolyte induces a cathodic overpotential on the seed sufficient to protect the seed from dissolution by acid in the electrolyte during immersion; electroplating copper into the features at a current density of about 3 mA/cm$^2$ or less; and removing the substrate from the electrolyte. In certain embodiments, the electrolyte may include between about 2-15 g/L acid, or between about 5-10 g/L acid. The pH of the electrolyte may be between about 0.2-2 in some implementations. The electrolyte may also include between about 10-500 milligrams per liter active organic additives. In some implementations, the active organic additives may include one or more accelerator compound. The concentration of accelerator may be less than about 20 milligrams per liter, or less than about 10 milligrams per liter. In certain cases, the active organic additives include one or more leveler compound. Certain embodiments use a suppressor compound that is a polymeric compound. In some implementations, the electrolyte includes less than about 5 g/L copper ions. Further, the electrolyte may include between about 10-150 milligrams per liter halide ions. In some implementations, the substrate has at least some features with openings smaller than about 20 nm. The substrate may be a 450 mm wafer in certain cases. When immersing the substrate in certain embodiments, the substrate may be immersed at an angle relative to the surface of the electrolyte and then oriented horizontally. The electroplating operation may include electroplating copper during a first plating phase to fill the substrate features with copper at a first deposition rate; and electroplating copper during a second plating phase to deposit an overburden layer of copper on the substrate at a second deposition rate that is higher than the first deposition rate. In some embodiments, the first deposition rate is between about 0.5-5 mA/cm$^2$ (e.g., about 5 mA/cm$^2$ or less, or about 3 mA/cm$^2$ or less). In certain cases the first deposition rate is higher (e.g., about 10 mA/cm$^2$ or less). The second deposition rate may, in certain embodiments, be between about 10-15 mA/cm². The method of electroplating may also include performing a post-plating treatment on the substrate. In certain implementations, the post-plating treatment includes rinsing and/or planarizing the substrate.

In another aspect of the embodiments herein, a method is provided for electroplating copper into damascene features, including receiving a substrate with a seed thickness of about 200 nm or less, on average; electrically biasing the substrate; immersing the substrate in an aqueous low copper acid-containing electrolyte including at least one suppressor compound, at least one accelerator compound, and less than about 10 g/L copper ions; during immersion, electroplating copper into the features by a bottom-up fill mechanism, where the low copper electrolyte permits plating using a sufficiently low current density such that the time of plating is adequate to allow the suppressor and accelerator to adsorb onto the seed and thereby enable bottom-up fill during immersion; and removing the substrate from the electrolyte. In certain implementations, the current density during electroplating is less than about 5 mA/cm², or less than about 3 mA/cm². In some embodiments, electroplating copper into the features includes electroplating copper during a first plating phase to fill the features with copper at a first deposition rate, and electroplating copper during a second plating phase to deposit an overburden layer of copper on the substrate at a second deposition rate that is higher than the first deposition rate. The electrolyte may include between about 2-15 g/L acid. In certain embodiments, the electrolyte includes less than about 5 g/L copper ions.

Another aspect of the disclosed implementations is an electrolyte including between about 1-10 g/L copper cations; between about 2-15 g/L acid; halide ions; one or more suppressor compound; one or more accelerator compound; where the electrolyte has a cloud point above 50° C. In certain embodiments, the acid is sulfuric acid. In other embodiments the acid may be methanesulfonic acid. The halide ions may be chloride ions. In some implementations, the copper cations are provided in a compound that dissociates into cations and anions, and the anions associated with the copper cations are the same species as anions formed from the acid. In certain embodiments, the concentration of accelerator compound in electrolyte is less than about 20 milligrams per liter, or less than about 10 milligrams per liter.

These and other features will be described below with reference to the associated drawings.

DETAILED DESCRIPTION

Figure 1:
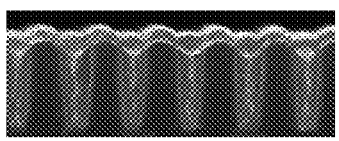
FIG. 1 shows 100 nm trenches plated at constant currents between 1 and 4 Amps, for a fixed amount of charge passed.
Figure 1:
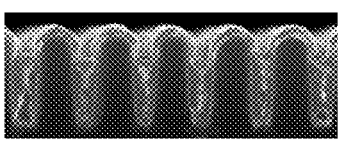
Figure 1:
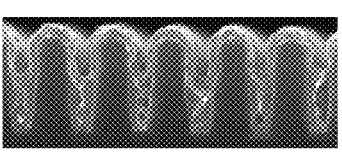
Figure 1:
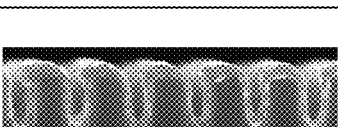
Figure 2:
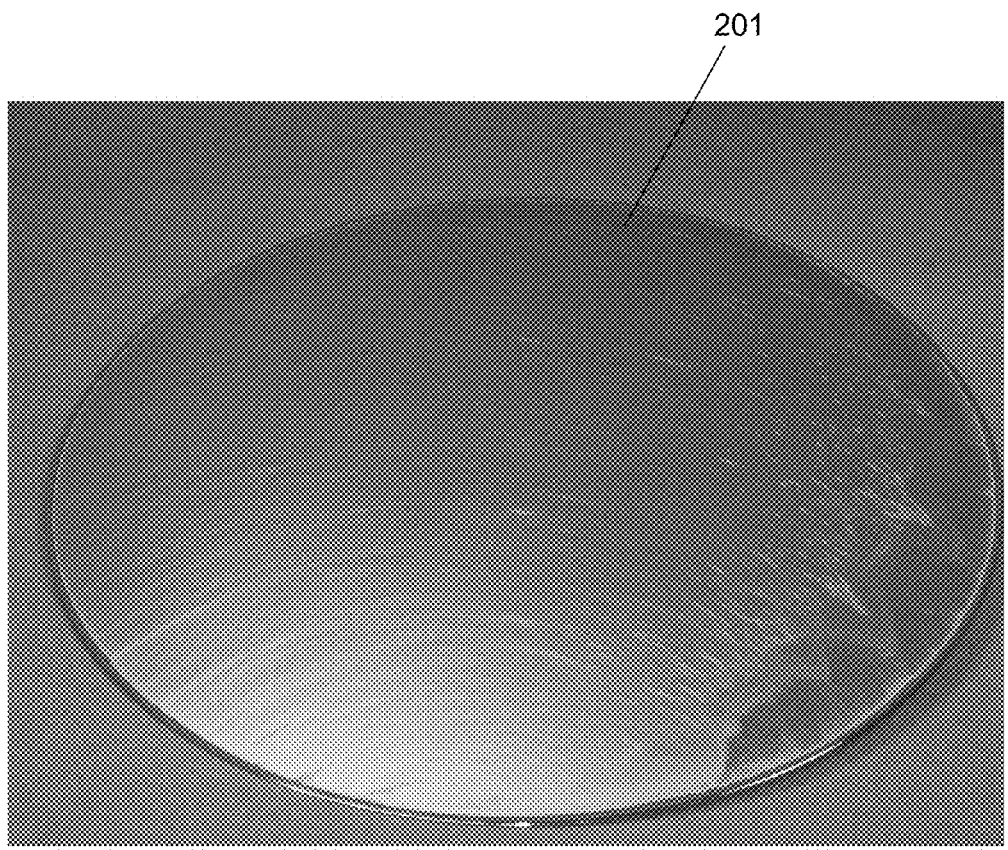
FIG. 2 shows a copper wafer that was plated at 21° C. in a plating bath containing a strong suppressor with a low cloud point of 27° C. Polymer agglomeration defects are visible.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. Further, the terms "electrolyte," "plating bath," "bath," and "plating solution" are used interchangeably. The term "low copper electrolyte" is understood to mean "electrolyte having a low concentration of copper ions." A low concentration of copper ions is understood to mean a concentration of less than about 10 g/L copper ions. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The embodiments herein utilize a low copper concentration electrolyte to achieve a high overpotential plating environment. For example, the copper concentration may be reduced by about 75% to 90% of the nominal mass/volume concentration used in conventional low acid copper plating baths, as compared to the conventional baths. In certain applications, the copper ion concentration is less than about 10 g/L or less than about 5 g/L. Some embodiments also utilize a low acid concentration electrolyte to further increase the overpotential. For example, the electrolyte may be between about 2-15 g/L, between about 5-10 g/L, less than about 10 g/L, or less than about 5 g/L acid. The increased overpotential provides various advantages such as allowing plating to occur at a slower rate, thereby making the deposition easier to control and resulting in a more uniform, more easily reproducible fill. By increasing the total amount of plating time, the influence of initial plating non-uniformities that occur during immersion become less important, and a more uniform fill results.

Typically, the copper electroplating solution includes organic bath additives to permit controlled high quality electrofill of recesses in a damascene substrate. Such additives typically include a suppressor and an accelerator and possibly a leveler. One role of the suppressor is to suppress electroplating and increase the surface polarization of the plating substrate. Before further describing the use of low copper concentration electroplating solutions, a discussion of plating additives is presented.

Suppressors

While not wishing to be bound to any theory or mechanism of action, it is believed that suppressors (either alone or in combination with other bath additives) are surface-kinetic polarizing compounds that lead to a significant increase in the voltage drop across the substrate-electrolyte interface, especially when present in combination with a surface chemisorbing halide (e.g., chloride or bromide). The halide may act as a bridge between the suppressor molecules and the wafer surface. The suppressor both (1) increases the local polarization of the substrate surface at regions where the suppressor is present relative to regions where the suppressor is absent, and (2) increases the polarization of the substrate surface generally. The increased polarization (local and/or general) corresponds to increased resistivity/impedance and therefore slower plating at a particular applied potential.

It is believed that suppressors are not incorporated into the deposited film, though they may slowly degrade over time. Suppressors are often relatively large molecules, and in many instances they are polymeric in nature (e.g., polyethylene oxide, polypropylene oxide, polyethylene glycol, polypropylene glycol, etc). Other examples of suppressors include polyethylene and polypropylene oxides with S- and/or N-containing functional groups, block polymers of polyethylene oxide and polypropylene oxides, etc. The suppressors can have linear chain structures or branch structures. It is common that suppressor molecules with various molecular weights co-exist in a commercial suppressor solution. Due in part to suppressors' large size, the diffusion of these compounds into a recessed feature is relatively slow.

Accelerators

While not wishing to be bound by any theory or mechanism of action, it is believed that accelerators (either alone or in combination with other bath additives) tend to locally reduce the polarization effect associated with the presence of suppressors, and thereby locally increase the electrodeposition rate. The reduced polarization effect is most pronounced in regions where the adsorbed accelerator is most concentrated (i.e., the polarization is reduced as a function of the local surface concentration of adsorbed accelerator). Example accelerators include, but are not limited to, dimercaptopropane sulfonic acid, dimercaptoethane sulfonic acid, mercaptopropane sulfonic acid, mercaptoethane sulfonic acid, bis-(3-sulfopropyl) disulfide (SPS), and their derivatives. Although the accelerator may become strongly adsorbed to the substrate surface and generally laterally-surface immobile as a result of the plating reactions, the accelerator is generally not incorporated into the film. Thus, the accelerator remains on the surface as metal is deposited. As a recess is filled, the local accelerator concentration increases on the surface within the recess. Accelerators tend to be smaller molecules and exhibit faster diffusion into recessed features, as compared to suppressors.

Levelers

While not wishing to be bound by any theory or mechanism of action, it is believed that levelers (either alone or in combination with other bath additives) act as suppressing agents to counteract the depolarization effect associated with accelerators, especially in the field region and at the side walls of a feature. The leveler may locally increase the polarization/surface resistance of the substrate, thereby slowing the local electrodeposition reaction in regions where the leveler is present. The local concentration of levelers is determined to some degree by mass transport. Therefore levelers act principally on surface structures having geometries that protrude away from the surface. This action "smooths" the surface of the electrodeposited layer. It is believed that leveler reacts or is consumed at the substrate surface at a rate that is at or near a diffusion limited rate, and therefore, a continuous supply of leveler is often beneficial in maintaining uniform plating conditions over time.

Leveler compounds are generally classified as levelers based on their electrochemical function and impact and do not require specific chemical structure or formulation. However, levelers often contain one or more nitrogen, amine, imide or imidazole, and may also contain sulfur functional groups. Certain levelers include one or more five and six member rings and/or conjugated organic compound derivatives. Nitrogen groups may form part of the ring structure. In amine-containing levelers, the amines may be primary, secondary or tertiary alkyl amines. Furthermore, the amine may be an aryl amine or a heterocyclic amine. Example amines include, but are not limited to, dialkylamines, trialkylamines, arylalkylamines, triazoles, imidazole, triazole, tetrazole, benzimidazole, benzotriazole, piperidine, morpholines, piperazine, pyridine, oxazole, benzoxazole, pyrimidine, quonoline, and isoquinoline. Imidazole and pyridine may be especially useful. Leveler compounds may also include ethoxide groups. For example, the leveler may include a general backbone similar to that found in polyethylene glycol or polyethyelene oxide, with fragments of amine functionally inserted over the chain (e.g., Janus Green B). Example epoxides include, but are not limited to, epi-halohydrins such as epichlorohydrin and epibromohydrin, and polyepoxide compounds. Polyepoxide compounds having two or more epoxide moieties joined together by an ether-containing linkage may be especially useful. Some leveler compounds are polymeric, while others are not. Example polymeric leveler compounds include, but are not limited to, polyethylenimine, polyamidoamines, and reaction products of an amine with various oxygen epoxides or sulfides. One example of a non-polymeric leveler is 6-mercapto-hexanol. Another example leveler is polyvinylpyrrolidone (PVP).

Bottom-Up Fill

In the bottom-up fill mechanism, a recessed feature on a plating surface tends to be plated with metal from the bottom to the top of the feature, and inward from the side walls towards the center of the feature. It is important to control the deposition rate within the feature and in the field region in order to achieve uniform filling and avoid incorporating voids into the features. The three types of additives described above are beneficial in accomplishing bottom-up fill, each working to selectively increase or decrease the polarization at the substrate surface.

After the substrate is immersed in electrolyte, the suppressor adsorbs onto the surface of the substrate, especially in exposed regions such as the field region. At the initial plating stages, there is a substantial differential in suppressor concentration between the top and bottom of a recessed feature. This differential is present due to the relatively large size of the suppressor molecule and its correspondingly slow transport properties. Over this same initial plating time, it is believed that accelerator accumulates at a low, substantially uniform concentration over the entire plating surface, including the bottom and side walls of the feature. Because the accelerator diffuses into features more rapidly than the suppressor, the initial ratio of accelerator:suppressor within the feature (especially at the feature bottom) is relatively high. The relatively high initial accelerator:suppressor ratio within the feature promotes rapid plating from the bottom of the feature upwards and from the sidewalls inwards. Meanwhile, the initial plating rate in the field region is relatively low due to the lower ratio of accelerator:suppressor. Thus, in the initial plating stages, plating occurs relatively faster within the feature and relatively slower in the field region.

As plating continues, the feature fills with metal and the surface area within the feature is reduced. Because of the decreasing surface area and the accelerator substantially remaining on the surface, the local surface concentration of accelerator within the feature increases as plating continues. This increased accelerator concentration within the feature helps maintain the differential plating rate beneficial for bottom-up fill.

In the later stages of plating, particularly as overburden deposits, the accelerator may build up in certain regions (e.g., above filled features) undesirably, resulting in local faster-than-desired plating. Leveler may be used to counteract this effect. The surface concentration of leveler is greatest at exposed regions of a surface (i.e., not within recessed features) and where convection is greatest. It is believed that the leveler displaces accelerator, increases the local polarization and decreases the local plating rate at regions of the surface that would otherwise be plating at a rate greater than at other locations on the deposit. In other words, the leveler tends, at least in part, to reduce or remove the influence of an accelerating compound at the exposed regions of a surface, particularly at protruding structures. Without leveler, a feature may tend to overfill and produce a bump. Therefore, in the later stages of bottom-up fill plating, levelers are beneficial in producing a relatively flat deposit.

The use of suppressor, accelerator and leveler, in combination, may allow a feature to be filled without voids from the bottom-up and from the sidewalls-inward, while producing a relatively flat deposited surface. The exact identity/composition of the additive compounds are typically maintained as trade secrets by the additive suppliers, thus, information about the exact nature of these compounds is not publicly available.

Plating Techniques and Process Considerations

Typical electroplating baths for filling damascene interconnects generally contain relatively high concentrations of copper cations (e.g., 40 g/L). High copper concentrations were understood to be beneficial because higher copper concentrations result in higher limiting currents that may be used during plating. Higher currents were seen as beneficial because they increased the rate of electrodeposition and thereby decreased processing time. Moreover, if the concentration of copper is too low, the electrolyte may experience copper depletion, resulting in significant fill defects. When the mass transfer of copper to the plating surface is too low at a given current (e.g., when the concentration of copper is too low or when the electrolyte is insufficiently turbulent), there is insufficient copper at the plating surface to sustain the reduction reaction. Instead, a parasitic reaction must occur to sustain the current delivered to the substrate. For example, the electrolyte itself may begin to decompose and generate gasses at the plating interface, resulting in significantly non-uniform plating and nodular growths on the substrate.

When plating with these high copper electrolytes, small features tend to fill fairly quickly (e.g., within 1 to 2 seconds). Because the timeframe for filling the small features is so short, the resulting fills often contain defects or are otherwise non-uniform. For example, because of the nature of the physical vapor deposition (PVD) processes used to deposit a copper seed layer, the seed thickness is not uniformly distributed, especially in areas along the sidewall of a feature. In some areas the seed layer may be so thin that the seed becomes discontinuous, which may lead to the formation of sidewall voids during subsequent rapid deposition.

As indicated, the immersion time is frequently a significant fraction of the total feature fill time in high copper electrolytes. Therefore, non-uniformities may be introduced as a consequence of the time difference between when the leading edge of a wafer contacts the electrolyte and when the trailing edge of the wafer contacts the electrolyte. Wafers are frequently immersed at an angle that deviates from horizontal in order to minimize bubble creation. In order to reduce non-uniformities introduced by the time it takes for the wafer to be fully immersed, it would be desirable to reduce the plating rate in recessed features, particularly during immersion. Use of a low copper electrolyte increases the polarization of the seed layer, thereby protecting it from dissolution without requiring a strong electrical bias. As a consequence, the low copper electrolyte permits seed layer protection without rapid electroplating. Non-uniformities are reduced.

Further, short feature filling timeframes required with high copper electrolytes may result in poor fill performance because the short timeframes are incompatible with the bottom-up fill mechanism during immersion, which requires some time for the organic additives to reach and adsorb onto the substrate surface at the relevant locations described above. As a particular example, when the accelerator compound(s) do not have time to reach and adsorb onto the bottom surface of a feature before substantial deposition begins, the bottom-up fill mechanism will be impaired and the feature fill will likely be poor. One method of addressing this concern is to use a high concentration of accelerator in the electrolyte. However, high accelerator concentrations may be undesirable in particular applications, and it is generally advantageous to use low concentrations of these additives in order to lower cost. The embodiments herein address the bottom-up fill timeframe issue by plating at a low copper ion concentration and consequently at a low current density, achieving a slower filling timeframe, especially for small features. The longer filling timeframe permits the organic additives sufficient time to diffuse or otherwise travel to their proper locations, adsorb onto the substrate surface, and promote bottom-up fill during immersion and before substantial deposition occurs. In certain implementations, the concentration of accelerator is less than about 20 milligrams per liter, or less than 10 milligrams per liter.

In order to increase the timeframe over which plating occurs, a lower current density is desired during plating. Lower current densities may also exhibit higher bottom-up fill efficiency. FIG. 1 shows the partial fill of 100 nm trenches with a 400 Å seed layer plated at constant currents between 1 and 4 Amps, for a fixed amount of charge passed. The trenches plated at the lower current are more filled because of increased bottom-up fill efficiency. However, lower current densities result in faster dissolution of the copper seed layer, leading to sidewall voids. The minimum current density required for a void-free fill in conventional electrolytes is still too high to allow good process control (i.e., plating occurs too quickly to achieve a reproducible, defect-free fill).

Typical electroplating baths and methods often cause the copper seed layer to dissolve/corrode to a certain degree when the substrate is first immersed in electrolyte. This dissolution may result in voids or other defects/non-uniformities in the deposit. The seed dissolution issue is especially problematic for thin seed layers, as thin layers are more easily dissolved than thicker layers. To achieve higher performance integrated circuits, many of the features of the integrated circuits are being fabricated with smaller feature sizes and higher densities of components. As the industry moves towards smaller features, the seed layers must become thinner and thinner to avoid "pinching off" the top of the feature before the bottom of the feature can be properly filled. In some damascene processing, for example, copper seed layers on 2×-nm node features may be as thin as or thinner than 50 Å. Technical challenges arise with smaller feature sizes in producing metal seed layers and metal interconnects substantially free of voids or defects.

One technique for protecting a copper seed layer is to increase the overpotential of the substrate-electrolyte interface. The overpotential may be increased in a variety of ways.

For example, using a stronger suppressor or a higher concentration of suppressor will result in a higher overpotential. Unfortunately, suppressors tend to form visible agglomerations above a threshold temperature, referred to as the cloud point. These agglomerations result in significant deposition defects because they can adhere to the surface of the substrate. Although the cloud point is the temperature at which the agglomerations become visible, it is believed that agglomerations begin forming at temperatures lower than the cloud point. Thus, the deposition process should be run at a temperature that is well below (e.g., 20° C. or more below) the cloud point of a particular electrolyte. Stronger suppressors tend to have very low cloud points (e.g., 27° C. for a proprietary suppressor that has more than 20 mV higher overpotential as compared to existing "moderate strength" commercial suppressors). Moreover, higher concentrations of suppressor result in lower cloud points (i.e., the more suppressor present in solution, the easier it is to form agglomerations at lower temperatures). Thus, although electrolytes with strong suppressors or high concentrations of weak to moderate suppressors may exhibit good fill performance, they cannot generally be used in conventional electroplating methods for small 10-20 nm features because they reduce the electrolyte's cloud level to an unacceptably low temperature.

While suppressors may be referred to as "weak" or "strong," it should be understood that these terms are relative and may vary over time. As the industry develops, stronger suppressors are created, and suppressors that used to be seen as "strong" may now be considered "moderate" or even "weak." Currently, the Excel suppressor available from Enthone may be considered a strong suppressor, while the Extreme Plus suppressor, also available from Enthone, may be considered a moderate suppressor.

Figure 3:
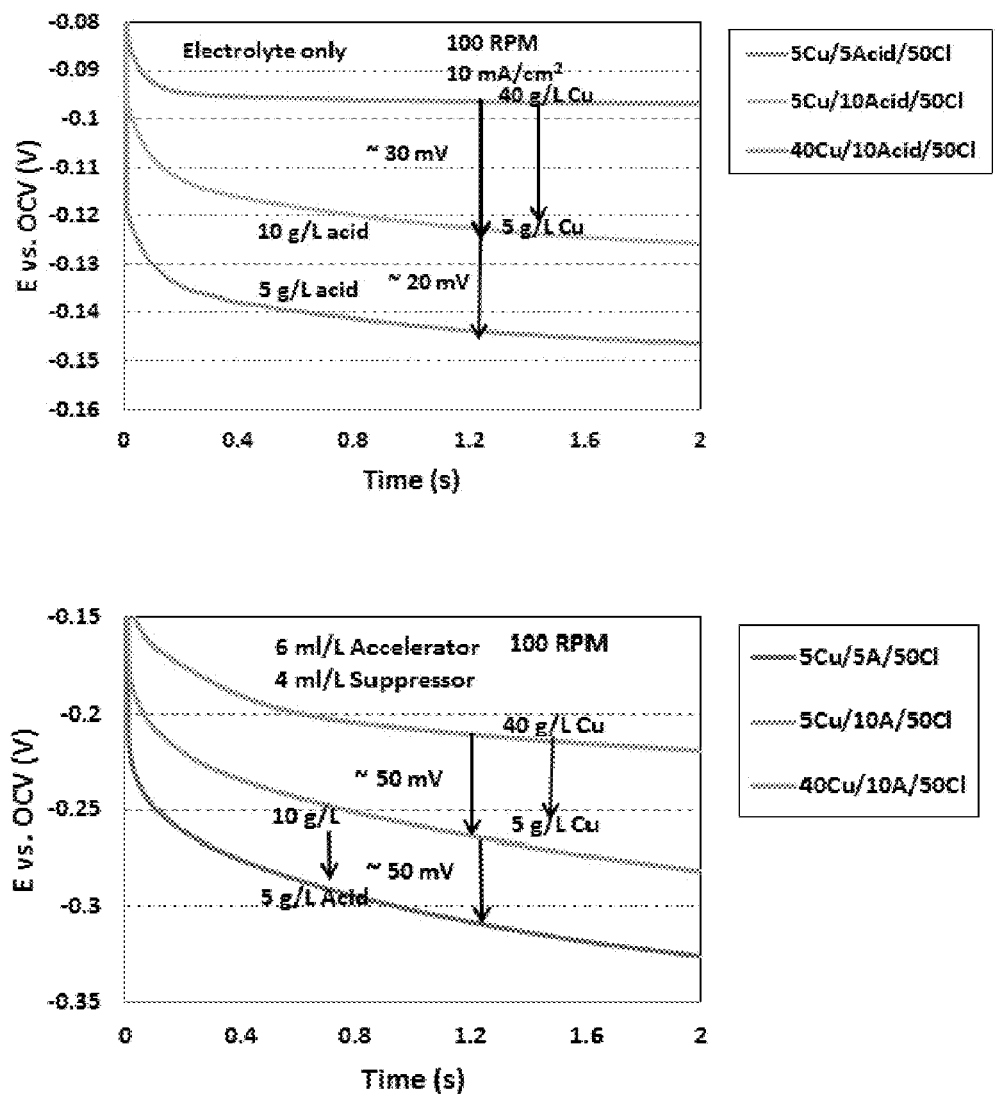
FIG. 3 shows galvanic polarization results collected on copper coated platinum rotating disk electrodes in three copper sulfate solutions, both with and without organic additives. The graphs illustrate increases in polarization resulting from decreases in copper ion concentration and acid concentration.

FIG. 3 shows the overpotential of three electrolytes and demonstrates that the overpotential may be increased by using electrolytes with low copper and low acid concentrations. In the upper panel, the electrolytes do not include organic additives, while in the lower panel the organic additives (6 mL/L Excel accelerator and 4 ml/L Excel suppressor) are present. The overpotential is measured by galvanostatic polarization between a copper coated platinum rotating disk electrode (RDE) and an Hg/HgSO$_4$ reference electrode. A thin layer of 0.66 µm copper is plated on a platinum electrode in an organic additive-free electrolyte. The electrode is then immersed in the bath to be tested with a copper sheet as the counter electrode. The voltage between the copper coated platinum RDE and the reference electrode is monitored while the electrode is rotated at 100 RPM at a current density of 10 mA/cm$^2$. The overpotential is expressed relative to the open-circuit voltage, which is the voltage between the copper coated platinum RDE and the Hg/HgSO$_4$ reference electrode when no current is passed.

The three tested electrolytes are all copper sulfate solutions. The first solution is a baseline solution of 40 g/L Cu$^{2+}$, 10 g/L acid, and 50 ppm Cl$^-$. The second solution is a low copper/high acid solution of 10 g/L Cu$^{2+}$, 10 g/L acid, and 50 ppm Cl$^-$. The third solution is a low copper/low acid solution of 10 g/L Cu$^{2+}$, 5 g/L acid, and 50 ppm Cl$^-$. As used herein, "low" and "high" concentrations are compared relative to one another. In other words, although 10 g/L acid is referred to as a "high acid" solution, it should be understood that 10 g/L may not be a high acid solution in absolute terms, but rather, is high compared to the 5 g/L acid solution.

Where there were no organic additives present (FIG. 3, upper panel), the use of the low copper/high acid solution increased the overpotential by about 30 mV, and the use of the low copper/low acid solution further increased the overpotential by about another 20 mV. Where the organic additives were present (FIG. 3, lower panel), the use of the low copper/high acid solution increased the overpotential by about 50 mV, and the use of the low copper/low acid solution further increased the overpotential by about another 50 mV. Thus, the use of a low copper, low acid electrolyte may increase the overpotential by about 100 mV when additives are present, as compared to conventional electroplating solutions. This increase in overpotential is larger than the increase typically achieved by using stronger suppressor formulations or changing the suppressor concentration in a given electrolyte (e.g., a typical increase of about 10 to 20 mV). Advantageously, the low copper electrolyte does not increase film impurities that typically occur when strong halide ions (e.g., bromide ions) or high concentrations of weaker halide ions are used.

Because the low copper concentration electrolytes exhibit higher overpotential (stronger polarization) at a given current density, the copper seed dissolution is also slower at a given current density. Due to the lower seed dissolution rate, lower current densities may be used without resulting in sidewall voids. The lower current densities allow the plating to occur more slowly, resulting in better fills with fewer defects in a more reproducible process.

The low copper, higher overpotential electrolyte presents several significant plating benefits explored in more detail herein. First, the higher overpotential provides better seed protection at a given current density. Better seed protection is especially beneficial for small features (e.g., 10-20 nm nodes) with thin seeds (e.g., thinner than about 100 Å) which may otherwise dissolve during plating, resulting in fill defects.

Next, higher overpotential promotes higher nucleation density on the copper seed. The high nucleation density is especially beneficial for thin seeds, especially those that may have marginal/discontinuous seed coverage. As mentioned above, thin seeds may have discontinuous coverage on a substrate surface due to the nature of the PVD process used to deposit the seed layer. The discontinuities in seed coverage tend to occur on the sidewalls of features. However, the combination of improved seed protection and high nucleation density enables plating to occur in small features with thin seed without the formation of sidewall voids, or at a minimum, with fewer/smaller voids than occur with conventional methods. Moreover, the high overpotential at low copper concentrations promotes high nucleation density at lower current densities than what is typically used when plating in conventional electrolytes. The high nucleation density promotes the formation of a continuous copper film instead of a discontinuous copper film having islands of copper.

Another advantage to using a low copper electrolyte is that it can promote uniform fill across a pattern of dense features. When many features are positioned near one another on a wafer, conventional electrolytes often result in non-uniform fills between the features. As electrolyte flows over the surface of a substrate, organic additives present in the electrolyte adsorb onto the surface, both within the features and in the field region. Features which are relatively upstream in the electrolyte flow path may therefore experience higher concentrations of additives, while features which are relatively downstream may experience lower concentrations of such additives.

The activity of the suppressor maxes out at a certain threshold suppressor concentration, referred to herein as the saturation point or suppressor saturation point. At concentrations above the saturation point, additional suppressor has very little or no effect on the overpotential at a fixed current density. It is desirable for the electrolyte to be near or above the suppressor saturation point during the initial stage of plating at all locations on the substrate surface. Thus, the suppressor concentration differences caused by flow direction (upstream vs. downstream) and/or pattern density have little or no impact on overpotential or copper deposition rate. If one location on a substrate (e.g., an upstream location) experiences a suppressor concentration above the saturation point, and another location on the substrate (e.g., a downstream location) experiences a suppressor concentration below the saturation point (the lower suppressor concentration being a result of adsorbing suppressor onto upstream locations more rapidly on the substrate surface), the difference in additive concentrations/adsorption rates may result in non-uniform fill between the upstream and downstream features. This same phenomenon also results in fill differences between features which are located in areas of dense features vs. features which are more isolated. The suppressor saturation point increases with increasing copper ion concentration in the electrolyte. Thus, in solutions with lower copper ion concentrations, the suppressor saturation point is lower, and it is easier for the suppressor concentration to remain above the saturation point at all locations during the initial stage of plating.

Figure 4:
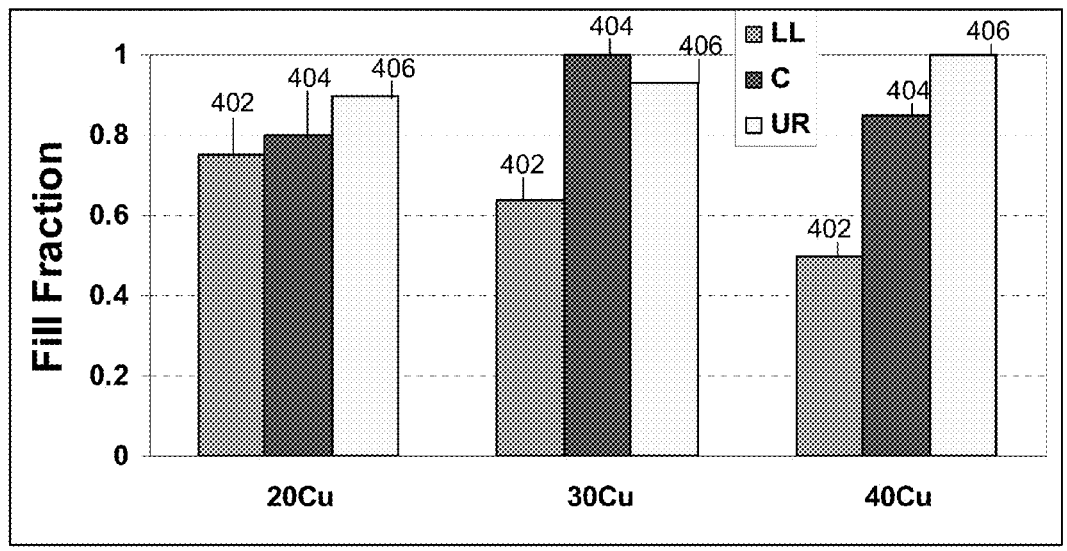
FIG. 4 is a graph demonstrating increased uniformity of fill fraction (and therefore fill rate) between upstream and downstream features on a substrate at low copper ion concentrations as opposed to high copper ion concentrations in electrolyte.

FIG. 4 shows the fill fraction of 20 nm technology nodes (i.e., 2x-nm features) at three locations on a wafer (upstream edge (LL, 402), center (C, 404), and downstream edge (UR, 406)) when plated at three different copper concentrations (20, 30 and 40 g/L copper ions). The other components of the electrolyte and the additive concentrations were the same for all three electrolytes. The fill fraction represents the fraction of the feature that was filled with copper during deposition. The fill fraction may be correlated to the fill rate. The features plated in electrolyte having 40 g/L copper ions show the widest variation in fill fraction. The uniformity of fill fraction increases slightly for the features plated in electrolyte having 30 g/L copper ions, and the uniformity is best for the features plated in electrolyte having the lowest copper ion concentration at 20 g/L. At the low copper condition, the fill fraction at the upstream edge was 85% of that seen at the downstream edge, which is significantly more uniform than at the 40 g/L copper ion condition where the fill fraction at the upstream edge was only about 50% of that seen at the downstream edge. For each set of features, there is a general trend towards higher fill fraction at the downstream edge (406) as compared to the upstream edge (402). This may be a result of different surface concentrations of adsorbed additives.

Furthermore, low copper electrolytes are beneficial because they increase the cloud point of the suppressor in the electrolyte. As discussed above, suppressors form agglomerations above certain temperatures. The temperature at which the agglomerations become visible is referred to as the cloud point, though it is believed that such agglomerations begin to form at temperatures lower than the cloud point. The agglomerations result in significant plating defects, and therefore, plating should occur at a temperature well below (e.g., 20° C. or more below) the cloud point of the electrolyte. The increase in cloud point resulting from the use of a low copper electrolyte is substantial. For example, the cloud point of a 2% (vol/vol) suppressor solution may be increased by about 25° C. when the copper concentration is reduced from 40 to 5 g/L in copper sulfate plating baths. Therefore, agglomeration defects can be significantly reduced or eliminated through the use of a low copper electrolyte. The increased cloud point also makes it possible to use strong suppressors (or higher suppressor concentrations) that could not be used in higher copper electrolytes due to their low cloud point. Furthermore, by increasing the cloud point of the suppressor/electrolyte, a wider range of process temperatures may be used for plating. Specifically, plating may occur at higher temperatures than was otherwise acceptable in conventional plating solutions.

Table 1 lists the cloud point of solutions of 2% (vol/vol) commercial suppressor (Extreme Plus from Enthone) in two electrolytes. The cloud point of the conventional high copper, high acid electrolyte is 35° C. The cloud point of the low copper, low acid electrolyte is 25° C. higher at 60° C. It is believed that all suppressors will exhibit similarly increased cloud points in electrolytes with low copper ion concentrations.

TABLE 1

| Electrolyte Composition | Cloud Point (° C.) |
|---|---|
| 40 g/L $Cu^{2+}$, 10 g/L acid, 50 ppm $Cl^-$ | 35 |
| 5 g/L $Cu^{2+}$, 5 g/L acid, 50 ppm $Cl^-$ | 60 |

An additional benefit to using low copper, low acid electrolytes is that the impact from the terminal effect is reduced. When plating begins, there is a significant potential drop between the edges of a wafer (where the wafer is connected to the power supply) and its center. The difference in potential results in faster plating at the edges and slower plating at the center of the substrate during the initial plating stage. The resulting film is generally edge-thick and center-thin, meaning that there may be significant plating non-uniformities between the different areas on a wafer. However, the impact of the terminal effect is reduced when a low copper, low acid electrolyte is used due to the higher impedance/lower conductivity of the electrolyte. Because of the lower electrolyte conductivity (due at least in part to the lower acid concentration), the voltage drop between the wafer edge and center due to resistive seed becomes less significant. The terminal effect is an important consideration when designing electroplating systems, and will be even more important as the industry transitions from 300 to 450 mm wafers. Further, the terminal effect is increasingly important as thinner seed layers are used to accommodate smaller features because the thinner seed layers exhibit higher sheet resistance.

Method of Electroplating with Low Copper Electrolyte

The electrolyte used in embodiments herein may contain copper ions, acid, water, halide ions, and organic additives such as suppressors, accelerators and levelers. The composition of the electrolyte is described in more detail below. The temperature of the electrolyte during deposition may be between about 25-40° C., for example 30° C., to achieve a reasonable deposition rate and temperature control.

In some embodiments, before a wafer enters the electrolyte, a constant potential is applied to the wafer in order to prevent seed dissolution or corrosion when the wafer first enters the electrolyte. The constant potential entry is further described in U.S. Pat. No. 6,551,483, issued Apr. 22, 2003, and incorporated by reference herein. In other embodiments, the potential is dynamic during the initial immersion period. Generally, a high potential is desired during entry in order to provide better seed protection, especially where thin copper seed layers are used. During the entry phase, the copper plating is conformal (i.e., the copper deposition rate is the same at all locations such as the field, sidewalls and bottom of features). In conventional methods, where the entry potential is too high, or where the potential is applied for too long, excessive conformal plating inside the features may lead to seam voids. However, low copper electrolytes allow for high potential entry without causing excessive conformal plating inside the substrate's features because a lower current density may be used. The minimum current density required to support plating in a particular electrolyte at a given mass transfer rate is proportional to the copper concentration of bulk solution. The high constant potential entry voltage followed by plating at a low current density in low copper electrolyte provides better seed protection, fill efficiency and uniformity, and process consistency.

Potentiostatic wafer entry may lead to non-uniform film roughness across the wafer when used with conventional electrolytes. When a wafer enters the plating solution at a fixed potential, the leading edge of the wafer often experiences a high initial current density compared to the rest of the wafer. Moreover, the leading edge is "wetted" first, meaning that it adsorbs the organic additives before the rest of the wafer. This differential in current density and/or additive adsorption time may cause non-uniform film roughness across the wafer. Film roughness may be analyzed through correlation to haze signals (e.g., haze signals collected on a KLA-Tencor metrology tool such as SP2), further discussed in U.S. Pat. No. 7,286,218, issued Oct. 23, 2007, and incorporated by reference herein.

Figure 5:
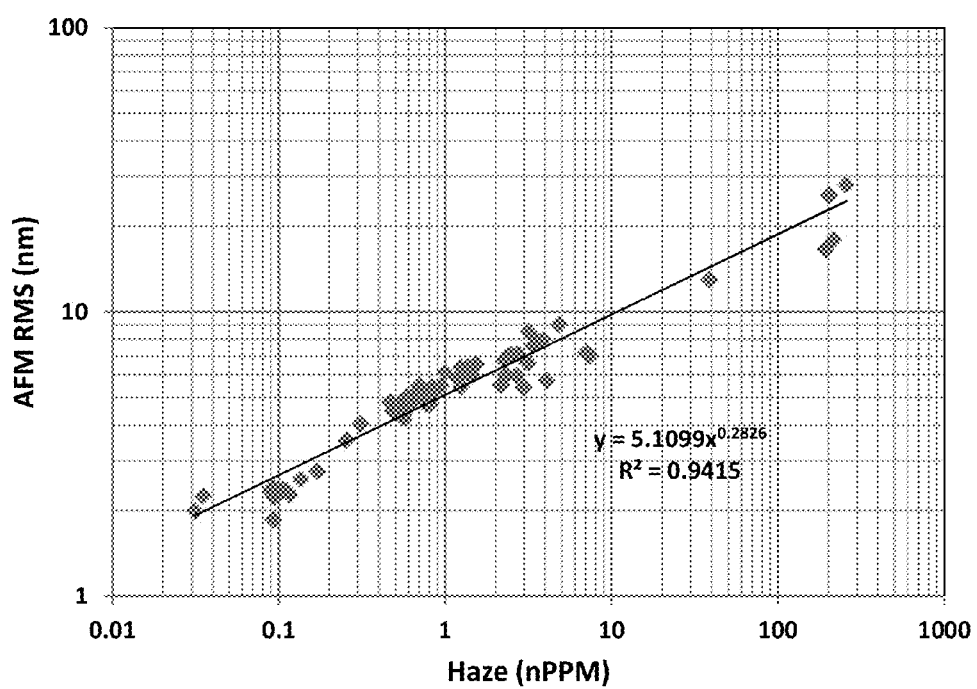
FIG. 5 shows a correlation between AFM RMS roughness and SP2 haze signals of electroplated copper films.

FIG. 5 shows a correlation curve between atomic force microscopy (AFM) root mean square (RMS) roughness and haze signals of electroplated films on 400 Å seed layer. The plated film thicknesses range from 5 to 120 nm. The plating baths include different additive packages from two different chemical vendors. The electrolyte used in plating had a copper ion concentration of 40 g/L, and it is believed that the copper ion concentration does not affect the correlation between AFM RMS roughness and haze signals. As used in this analysis, higher haze values correspond to rougher films.

Figure 6:
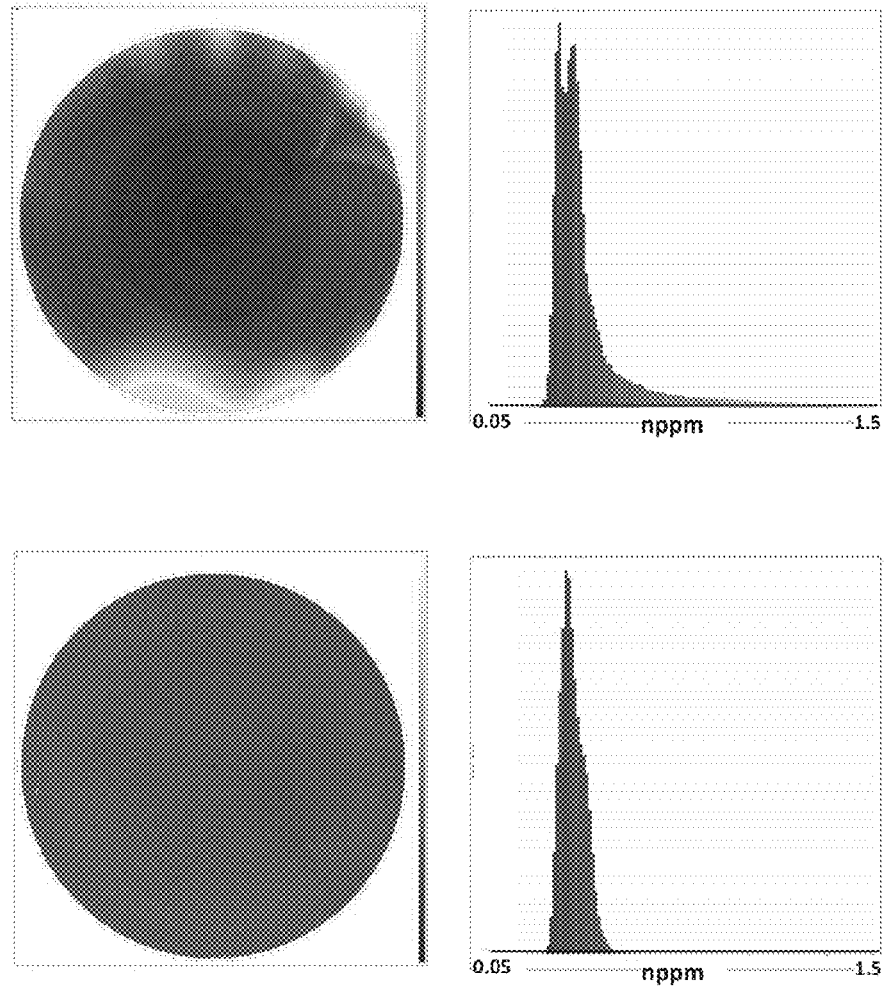
FIG. 6 shows haze maps (left) and histograms (right) of 50 Å films plated on 400 Å seed layers in high copper (top) and low copper (bottom) electrolytes.

FIG. 6 shows the haze maps and histograms of two 501 films plated on 400 Å copper seed layers deposited through PVD. The upper panels of FIG. 5 correspond to a film plated in a conventional high copper electrolyte comprising 40 g/L $Cu^{2+}$, 10 g/L acid, 50 ppm $Cl^-$, 12 ml/L accelerator, 4 ml/L suppressor and 4 ml/L leveler. The lower panels of FIG. 5 correspond to a film plated in a low copper electrolyte comprising 5 g/L $Cu^{2+}$, 10 g/L acid, 50 ppm $Cl^-$, 3 ml/L accelerator, 2 ml/L suppressor and 1 ml/L leveler. It should be noted that the different additive concentrations used herein may have some impact on haze values or uniformity. The additive concentrations are generally optimized for a particular desired fill, and such optimized additive concentrations are different for different electrolytes. Thus, the comparison shown here may include effects from the interaction among copper cations and electrolyte additives as well. The entry speed was 200 mm/s (in the z-direction, normal to the surface of the wafer), at a rotation speed of 150 RPM. The potentiostatic entry voltage was 0.5 V, and after a trigger delay time of 0.1 s, a current of 1 A was applied. Notably, the film plated in the low copper electrolyte has a tighter distribution of haze signals, and the haze signals max out at a lower value as compared to the film plated in the high copper electrolyte. This means that the low copper electrolyte resulted in a smoother, more uniform film. Based on the correlation curve in FIG. 5, the film roughness of the films plated in the low copper and high copper electrolytes are about 2-3 nm and 2-5 nm, respectively. While not wishing to be bound by any theory, it is believed that the improvement in film roughness uniformity may be caused by lower current density or deposition rate at a given potential during initial wafer entry.

In many embodiments herein, after the initial immersion period, a substrate is plated at a relatively low constant current or current density as the features are filled. For example, the substrate may be plated at a current density between about 0.5-5 mA/cm² during this fill stage. In some cases the current density during this fill stage is about 5 mA/cm² or less, or about 3 mA/cm² or less. In certain implementations the current density during the fill stage is higher, for example, about 10 mA/cm² or less. A high mass transfer rate is beneficial during the fill stage in order to avoid copper depletion inside the features, especially at relatively higher current densities. Higher mass transfer rates may be achieved by increasing the flow rate of the electrolyte, as well as by increasing the rotation speed of the electrode, which increases convection to the substrate surface. The mass transfer rate should generally be sufficiently high such that the electrodeposition reaction is kinetically controlled, not mass transfer controlled. In certain embodiments, the current or current density may be dynamic over time. Many suitable electroplating processes and systems may be used to implement the embodiments described herein. Examples of such processes and systems are described in the following U.S. patents and U.S. patent applications, each incorporated herein by reference in its entirety: U.S. Pat. Nos. 6,333,275 and 8,308,931, and U.S. Patent Application No. 61/315,679, filed Mar. 19, 2010 and titled "Electrolyte Loop with Pressure Regulation for Separated Anode Chamber of Electroplating System."

After plating is complete, the substrate may be removed from the electrolyte, rinsed, dried and processed for further use.

Figure 7:
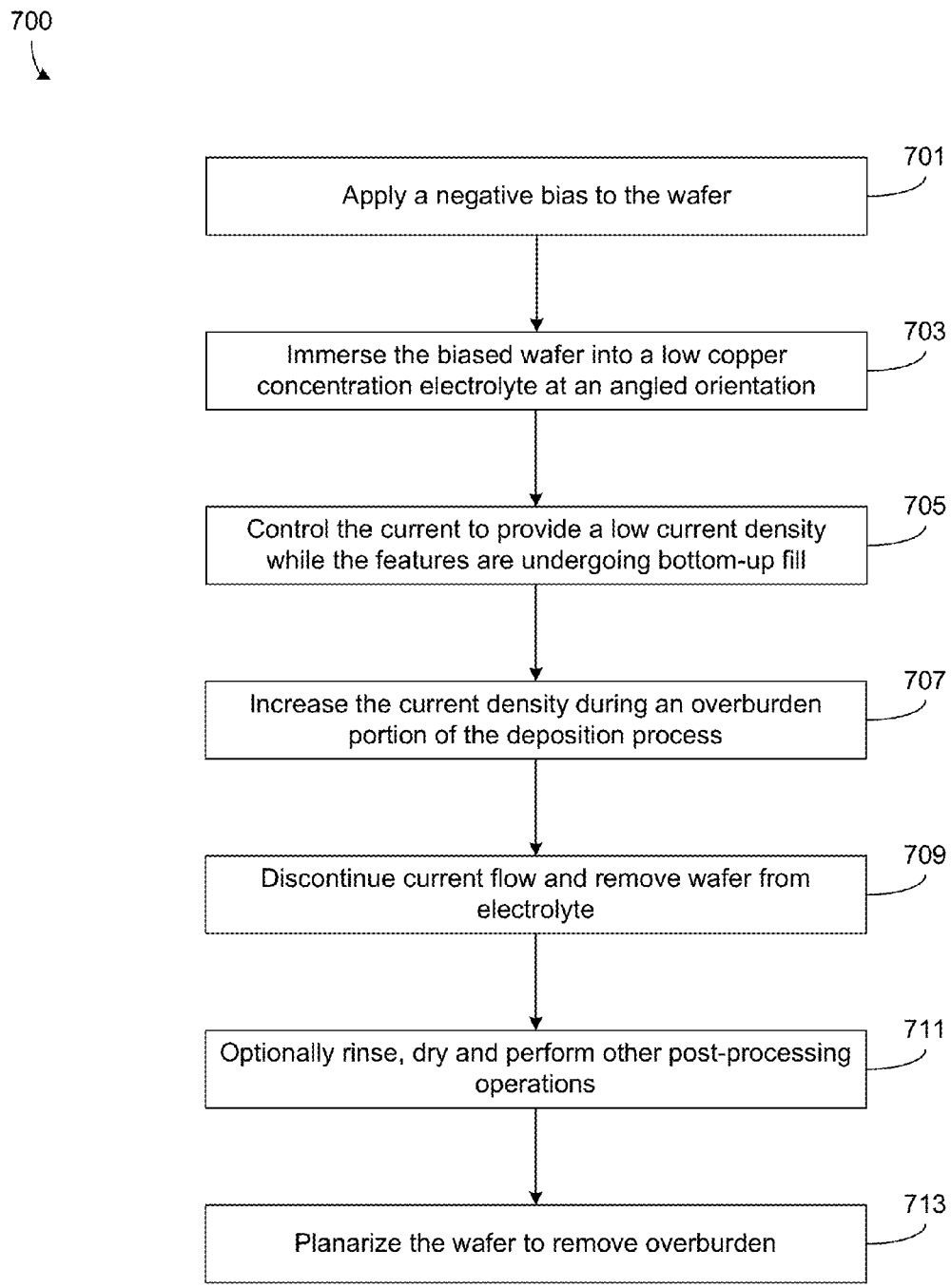
FIG. 7 shows a flowchart of a method of electroplating copper according to the embodiments herein.

FIG. 7 shows an example of a method of electroplating copper 700 according to the embodiments described herein. The plating process may be divided into the following basic stages: immersion, fill, overburden and removal. In the immersion stage beginning at block 701, a negative bias is applied to the wafer. At block 703, the biased wafer is immersed into a low copper concentration electrolyte at an angled orientation. The wafer enters the plating bath at a high constant potential between about 1-2V, depending on seed thickness. A higher potential may be applied when the seed is thinner or when the sheet resistance of the seed is higher. The wafer enters the plating bath at an angle (e.g., 2-4 degrees) with respect to the surface of the plating solution in order to avoid trapping air bubbles on the wafer surface. The entry angle may be fixed, or it may be dynamic as the wafer becomes more fully immersed. The vertical speed of the wafer during immersion may be between about 5-300 mm/s, between about 5-200 mm/sec, or between about 100-300 mm/sec in certain implementations. The vertical speed should be relatively fast in order to achieve uniform initial plating across the wafer, but should not be so fast as to cause defect issues due to splashing. The rotation speed of the electrode may be optimized such that there is (1) a low limiting current at high entry voltage during potentiostatic entry, and (2) a uniform initial plating rate across the wafer. A low rotation speed is generally beneficial where there is a low limiting current, while a high rotation speed is generally beneficial to promote uniform initial plating across the wafer. Thus, the entry rotation speed of the electrode should be set at an intermediate level, for example, between about 30-120 RPM. The flow rate of plating solution during the initial immersion stage may be relatively low (e.g., between about 3-6 LPM). After the wafer is fully immersed in the plating bath, the wafer is set to a tilt angle of 0.

During the fill stage of plating at block 705, the features on the substrate undergo bottom-up fill as described herein. The current density during the fill stage may be relatively low (e.g., between about 0.5-5 mA/cm$^2$). Further, the mass transfer rate during the fill stage may be relatively low in order to avoid diffusion of leveler into the features. For example, the flow rate of electrolyte may be about 6 LPM during this stage. The electrode rotation speed may be relatively low during the fill stage (e.g., between about 12-30 RPM).

After the features are filled, an overburden stage occurs at block 707. During the overburden stage, a higher current and/or current density is applied (e.g., between about 10-15 mA/cm$^2$), and a higher rate of mass transfer is used (e.g., an electrolyte flow rate between about 12-20 LPM, and an electrode rotation speed between about 60-120 RPM). Next, at block 709 the wafer may be removed from the electrolyte. At block 711 the wafer may be optionally rinsed, dried and processed for further use. Next, at block 713 the wafer is planarized to remove overburden. Operations 711 and 713 may occur in either order.

Figure 8:
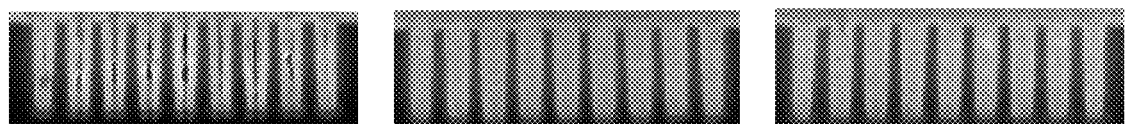
FIG. 8 shows the fill of 48 nm trenches plated in three electrolytes. The left panel corresponds to a film plated in a high copper, high acid electrolyte, the middle panel corresponds to a film plated in a low copper, high acid electrolyte, and the right panel corresponds to a film plated in a low copper, low acid electrolyte.

FIG. 8 shows the fill of 48 nm trenches (i.e., features) plated in two-component plating solutions in three different electrolyte compositions. "Two-component plating solution" means that the electrolyte included both accelerator and suppressor. The left panel of FIG. 8 corresponds to trenches filled in a high copper/high acid electrolyte having 40 g/L Cu$^{2+}$, 10 g/L acid, 50 ppm Cl$^-$, 6 ml/L accelerator, and 4 mL/L suppressor. The middle panel corresponds to trenches filled in a low copper/high acid electrolyte having 5 g/L Cu$^{2+}$, 10 g/L acid, 50 ppm Cl$^-$, 3 ml/L accelerator, and 2 mL/L suppressor. The right panel corresponds to trenches filled in a low copper/low acid electrolyte having 5 g/L Cu$^{2+}$, 5 g/L acid, 50 ppm Cl$^-$, 3 ml/L accelerator, and 2 mL/L suppressor. Each set of trenches was plated for 0.15 seconds in a beaker with a potentiostatic entry at 1V as compared to an Hg/HgSO$_4$ reference electrode, followed by plating at a constant current density of 3 mA/cm$^2$. The rotation speed of the electrode during plating was 100 RPM. The trenches filled in the high copper/high acid solution (FIG. 8, left panel) show conformal plating with significant seam void defects, while the trenches plated in the low copper solutions (FIG. 8, center and right panels) show no such defects. The use of the low copper electrolyte substantially reduced the number and severity of plating defects seen in the features and appears to have eliminated such defects altogether.

Composition of Electrolyte

Electrolytes used in the embodiments disclosed herein may contain copper ions, acid, water, halide ions, and organic additives such as suppressors, accelerators and levelers. The concentration of copper ions (Cu$^{2+}$) in the electrolyte may be between about 1-10 g/L. In certain implementations the concentration of copper ions is about 20 g/L or less, about 10 g/L or less, or about 5 g/L or less. In some cases, the concentration of copper ions is between about 4-10 g/L. The copper ions are typically provided in the form of a copper salt. Example copper salts include, but are not limited to, copper sulfate, copper methanesulfonate, copper pyrophosphate, copper propanesulfonate, etc. The copper concentrations cited herein include only the mass of the copper cations and do not include the mass of any associated anions. The concentration of acid in the electrolyte may be less than about 10 g/L acid. In some cases, the acid concentration is between about 2-15 g/L acid, though in certain implementations the concentration is limited to between about 5-10 g/L. Other implementations of the invention may utilize acid concentrations above 15 g/L. Example acids include, but are not limited to, sulfuric acid and methanesulfonic acid. The acid will dissociate into cations and anions, and the anions are typically the same species as anions formed from the copper salt. The acid concentrations cited herein include the mass of both the hydrogen cation and the associated anion in solution. The acid concentration may be varied to control the conductivity of the plating bath. In addition to increasing the polarization of the electrolyte as described above, low acid electrolytes may be further beneficial because they use less acid (reducing cost), are safer to use, and are easier on the plating equipment (causing less equipment damage over time).

The electrolytes used herein are typically aqueous and generally contain halide ions. Example halide ions include, but are not limited to, chloride ions, bromide ions, iodide ions, and combinations thereof. It is believed that halide ions act as bridges to assist the adsorption of organic additives on the copper surface to achieve bottom-up fill of the features. The concentration of halide ions may range between about 10-100 ppm, e.g., about 50 ppm. In certain embodiments, the oxygen level of the electrolyte is less than about 1-2 ppm in order to minimize seed oxidation/corrosion in the electrolyte.

Next, the electrolyte may contain organic additives such as suppressors, accelerators and/or levelers. A detailed description of the function, interaction and identity of these additives is included above. The concentration of organic additives in the electrolyte may range between about 10-500 mg/L. This concentration corresponds to the mass of active components in the additives and does not include the mass of non-active components. The use of a low copper electrolyte allows plating to occur at relatively low suppressor concentrations as compared to conventional electroplating electrolytes. In certain embodiments, the concentration of suppressor is between about 50-200 ppm, between about 50-300 ppm, or below about 200 ppm. Because the concentration of suppressor is relatively low, the electrolyte will tend to have a cloud point that is relatively high. In some embodiments, the cloud point of the electrolyte is between about 40-100° C., between about 50-100° C., or between about 60-100° C.

Three example electrolyte compositions according to the embodiments herein are shown in Table 2. These compositions are included for exemplary purposes only, and should not be construed as limiting.

TABLE 2

|  | Electrolyte 1 | Electrolyte 2 | Electrolyte 3 |
|---|---|---|---|
| Copper ion concentration (g/L) | 4-20 | 4-20 | 4-20 |
| Sulfuric acid concentration (g/L) | 5-10 | 5-10 | 5-10 |
| Halide ion concentration (mg/L) | 10-100 mg/L Cl− | 10-100 mg/L Cl−; 0.5-25 mg/L Br− | 10-100 mg/L Br−; |
| Organic additive concentration (mg/L) | 10-500 | 10-500 | 10-500 |

Apparatus for Plating

Many apparatus configurations may be used in accordance with the embodiments described herein. One example apparatus includes a clamshell fixture that seals a wafer's backside away from the plating solution while allowing plating to proceed on the wafer's face. The clamshell fixture may support the wafer, for example, via a seal placed over the bevel of the wafer, or by means such as a vacuum applied to the back of a wafer in conjunction with seals applied near the bevel.

The clamshell fixture should enter the bath in a way that allows good wetting of the wafer's plating surface. The quality of substrate wetting is affected by multiple variables including, but not limited to, clamshell rotation speed, vertical entry speed, and the angle of the clamshell relative to the surface of the plating bath. These variables and their effects are further discussed in U.S. Pat. No. 6,551,487, incorporated by reference herein. In certain implementations, the electrode rotation rate is between about 5-125 RPM, the vertical entry speed is between about 5-300 mm/s, and the angle of the clamshell relative to the surface of the plating bath is between about 1-10 degrees. One of the goals in optimizing these variables for a particular application is to achieve good wetting by fully displacing air from the wafer surface.

Figure 9:
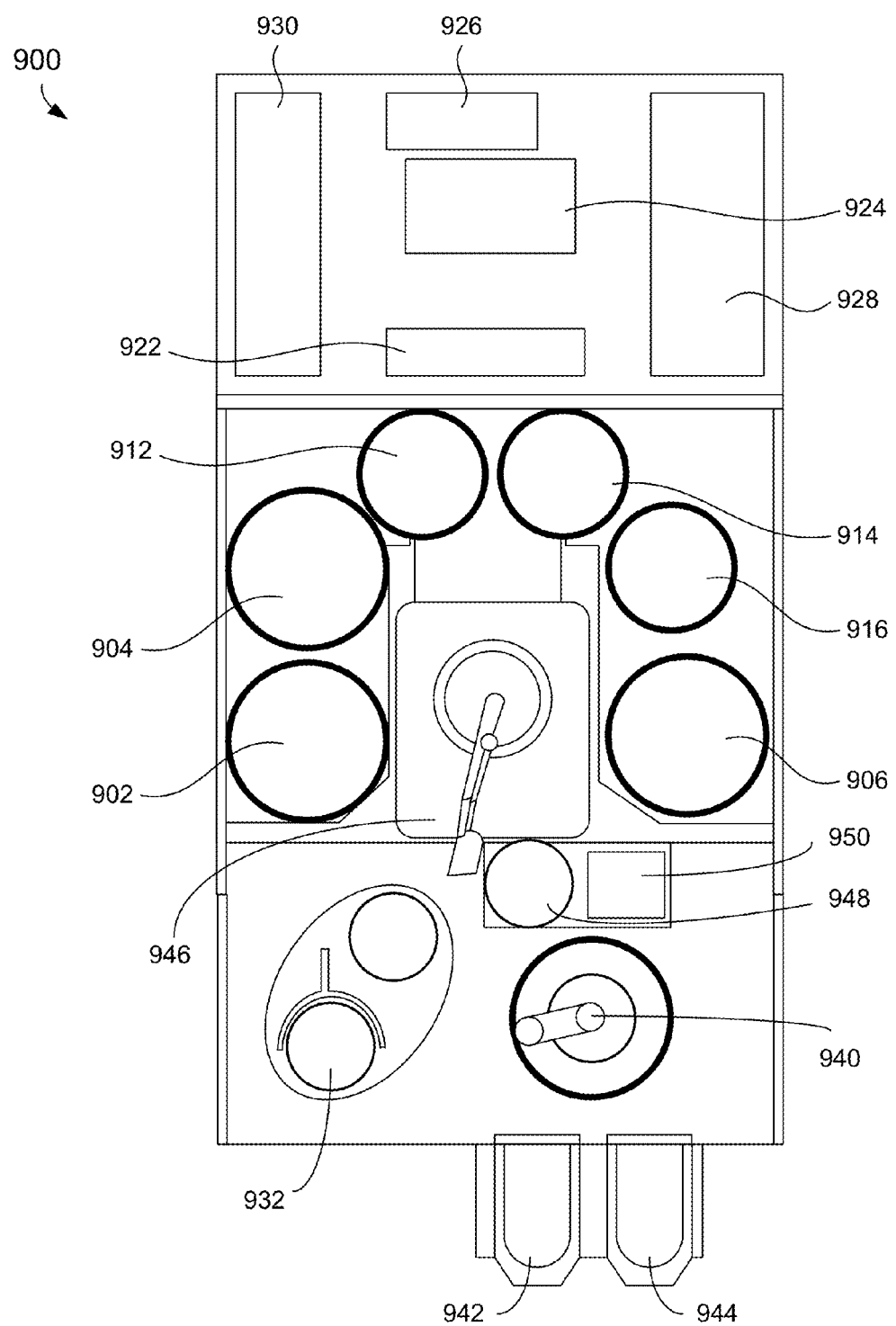
FIG. 9 shows a schematic of a top view of an example electrodeposition apparatus.

The electrodeposition methods disclosed herein can be described in reference to, and may be employed in the context of, various electroplating tool apparatuses. One example of a plating apparatus that may be used according to the embodiments herein is the Lam Research Sabre tool. Electrodeposition, including substrate immersion, and other methods disclosed herein can be performed in components that form a larger electrodeposition apparatus. FIG. 9 shows a schematic of a top view of an example electrodeposition apparatus. The electrodeposition apparatus 900 can include three separate electroplating modules 902, 904, and 906. The electrodeposition apparatus 900 can also include three separate modules 912, 914, and 916 configured for various process operations. For example, in some embodiments, one or more of modules 912, 914, and 916 may be a spin rinse drying (SRD) module. In other embodiments, one or more of the modules 912, 914, and 916 may be post-electrofill modules (PEMs), each configured to perform a function, such as edge bevel removal, backside etching, and acid cleaning of substrates after they have been processed by one of the electroplating modules 902, 904, and 906.

The electrodeposition apparatus 900 includes a central electrodeposition chamber 924. The central electrodeposition chamber 924 is a chamber that holds the chemical solution used as the electroplating solution in the electroplating modules 902, 904, and 906. The electrodeposition apparatus 900 also includes a dosing system 926 that may store and deliver additives for the electroplating solution. A chemical dilution module 922 may store and mix chemicals to be used as an etchant. A filtration and pumping unit 928 may filter the electroplating solution for the central electrodeposition chamber 924 and pump it to the electroplating modules.

A system controller 930 provides electronic and interface controls required to operate the electrodeposition apparatus 900. The system controller 930 (which may include one or more physical or logical controllers) controls some or all of the properties of the electroplating apparatus 900. The system controller 930 typically includes one or more memory devices and one or more processors. The processor may include a central processing unit (CPU) or computer, analog and/or digital input/output connections, stepper motor controller boards, and other like components. Instructions for implementing appropriate control operations as described herein may be executed on the processor. These instructions may be stored on the memory devices associated with the system controller 930 or they may be provided over a network. In certain embodiments, the system controller 930 executes system control software.

The system control software in the electrodeposition apparatus 900 may include instructions for controlling the timing, mixture of electrolyte components (including the concentration of one or more electrolyte components), inlet pressure, plating cell pressure, plating cell temperature, substrate temperature, current and potential applied to the substrate and any other electrodes, substrate position, substrate rotation, and other parameters of a particular process performed by the electrodeposition apparatus 900. The system control logic may also include instructions for electroplating under conditions that are tailored to be appropriate for a low copper concentration electrolyte and the high overpotential associated therewith. For example, the system control logic may be configured to provide a relatively low current density during the bottom-up fill stage and/or a higher current density during the overburden stage. The control logic may also be configured to provide certain levels of mass transfer to the wafer surface during plating. For example, the control logic may be configured to control the flow of electrolyte to ensure sufficient mass transfer to the wafer during plating such that the substrate does not encounter depleted copper conditions. In certain embodiments the control logic may operate to provide different levels of mass transfer at different stages of the plating process (e.g., higher mass transfer during the bottom-up fill stage than during the overburden stage, or lower mass transfer during the bottom-up fill stage than during the overburden stage). Further, the system control logic may be configured to maintain the concentration of one or more electrolyte components within any of the ranges disclosed herein. As a particular example, the system control logic may be designed or configured to maintain the concentration of copper cations between about 1-10 g/L. System control logic may be configured in any suitable way. For example, various process tool component sub-routines or control objects may be written to control operation of the process tool components necessary to carry out various process tool processes. System control software may be coded in any suitable computer readable programming language. The logic may also be implemented as hardware in a programmable logic device (e.g., an FPGA), an ASIC, or other appropriate vehicle.

In some embodiments, system control logic includes input/output control (IOC) sequencing instructions for controlling the various parameters described above. For example, each phase of an electroplating process may include one or more instructions for execution by the system controller 930. The instructions for setting process conditions for an immersion process phase may be included in a corresponding immersion recipe phase. In some embodiments, the electroplating recipe phases may be sequentially arranged, so that all instructions for an electroplating process phase are executed concurrently with that process phase.

The control logic may be divided into various components such as programs or sections of programs in some embodiments. Examples of logic components for this purpose include a substrate positioning component, an electrolyte composition control component, a pressure control component, a heater control component, and a potential/current power supply control component.

In some embodiments, there may be a user interface associated with the system controller 930. The user interface may include a display screen, graphical software displays of the apparatus and/or process conditions, and user input devices such as pointing devices, keyboards, touch screens, microphones, etc.

In some embodiments, parameters adjusted by the system controller 930 may relate to process conditions. Non-limiting examples include bath conditions (temperature, composition, and flow rate), substrate position (rotation rate, linear (vertical) speed, angle from horizontal) at various stages, etc. These parameters may be provided to the user in the form of a recipe, which may be entered utilizing the user interface.

Signals for monitoring the process may be provided by analog and/or digital input connections of the system controller 930 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

In one embodiment, the instructions can include inserting the substrate in a wafer holder, tilting the substrate, biasing the substrate during immersion, and electrodepositing a copper containing structure on a substrate.

A hand-off tool 940 may select a substrate from a substrate cassette such as the cassette 942 or the cassette 944. The cassettes 942 or 944 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 940 may hold the substrate using a vacuum attachment or some other attaching mechanism.

The hand-off tool 940 may interface with a wafer handling station 932, the cassettes 942 or 944, a transfer station 950, or an aligner 948. From the transfer station 950, a hand-off tool 946 may gain access to the substrate. The transfer station 950 may be a slot or a position from and to which hand-off tools 940 and 946 may pass substrates without going through the aligner 948. In some embodiments, however, to ensure that a substrate is properly aligned on the hand-off tool 946 for precision delivery to an electroplating module, the hand-off tool 946 may align the substrate with an aligner 948. The hand-off tool 946 may also deliver a substrate to one of the electroplating modules 902, 904, or 906 or to one of the three separate modules 912, 914, and 916 configured for various process operations.

An example of a process operation according to the methods described above may proceed as follows: (1) electrodeposit copper onto a substrate to form a copper containing structure in the electroplating module 904; (2) rinse and dry the substrate in SRD in module 912; and, (3) perform edge bevel removal in module 914.

An apparatus configured to allow efficient cycling of substrates through sequential plating, rinsing, drying, and PEM process operations may be useful for implementations for use in a manufacturing environment. To accomplish this, the module 912 can be configured as a spin rinse dryer and an edge bevel removal chamber. With such a module 912, the substrate would only need to be transported between the electroplating module 904 and the module 912 for the copper plating and EBR operations.

Figure 10:
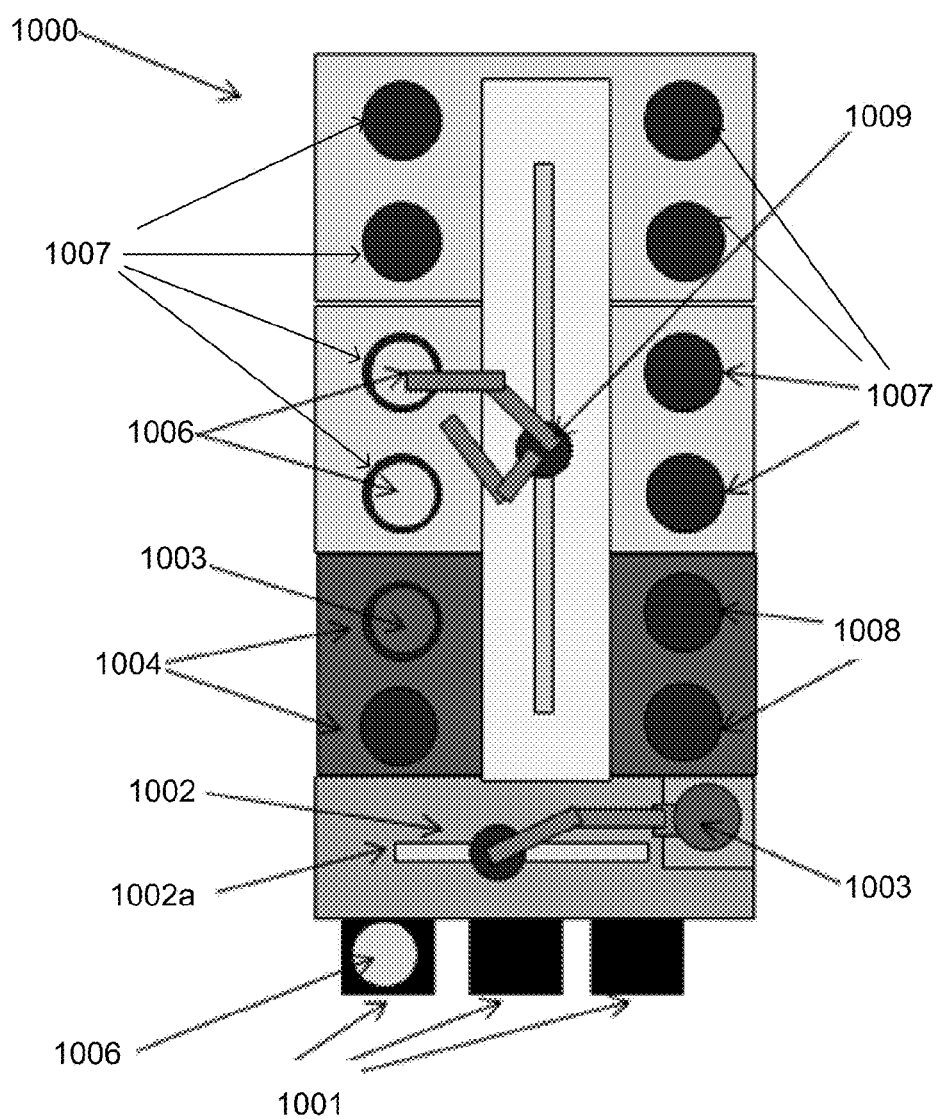
FIG. 10 shows a schematic of a top view of an alternative example electrodeposition apparatus.

An alternative embodiment of an electrodeposition apparatus 1000 is schematically illustrated in FIG. 10. In this embodiment, the electrodeposition apparatus 1000 has a set of electroplating cells 1007, each containing an electroplating bath, in a paired or multiple "duet" configuration. In addition to electroplating per se, the electrodeposition apparatus 1000 may perform a variety of other electroplating related processes and sub-steps, such as spin-rinsing, spin-drying, metal and silicon wet etching, electroless deposition, pre-wetting and pre-chemical treating, reducing, annealing, photoresist stripping, and surface pre-activation, for example. The electrodeposition apparatus 1000 is shown schematically looking top down in FIG. 10, and only a single level or "floor" is revealed in the figure, but it is to be readily understood by one having ordinary skill in the art that such an apparatus, e.g. the Novellus Sabre™ 3D tool, can have two or more levels "stacked" on top of each other, each potentially having identical or different types of processing stations.

Referring once again to FIG. 10, the substrates 1006 that are to be electroplated are generally fed to the electrodeposition apparatus 1000 through a front end loading FOUP 1001 and, in this example, are brought from the FOUP to the main substrate processing area of the electrodeposition apparatus 1000 via a front-end robot 1002 that can retract and move a substrate 1006 driven by a spindle 1003 in multiple dimensions from one station to another of the accessible stations—two front-end accessible stations 1004 and also two front-end accessible stations 1008 are shown in this example. The front-end accessible stations 1004 and 1008 may include, for example, pre-treatment stations, and spin rinse drying (SRD) stations. Lateral movement from side-to-side of the front-end robot 1002 is accomplished utilizing robot track 1002a. Each of the substrates 1006 may be held by a cup/cone assembly (not shown) driven by a spindle 1003 connected to a motor (not shown), and the motor may be attached to a mounting bracket 1009. Also shown in this example are the four "duets" of electroplating cells 1007, for a total of eight electroplating cells 1007. The electroplating cells 1007 may be used for electroplating copper for the copper containing structure and electroplating solder material for the solder structure. A system controller (not shown) may be coupled to the electrodeposition apparatus 1000 to control some or all of the properties of the electrodeposition apparatus 1000. The system controller may be programmed or otherwise configured to execute instructions according to processes described earlier herein.

The electroplating apparatus/methods described hereinabove may be used in conjunction with lithographic patterning tools or processes, for example, for the fabrication or manufacture of semiconductor devices, displays, LEDs, photovoltaic panels and the like. Generally, though not necessarily, such tools/processes will be used or conducted together in a common fabrication facility. Lithographic patterning of a film generally comprises some or all of the following steps, each step enabled with a number of possible tools: (1) application of photoresist on a work piece, i.e., a substrate, using a spin-on or spray-on tool; (2) curing of photoresist using a hot plate or furnace or UV curing tool; (3) exposing the photoresist to visible, UV, or x-ray light with a tool such as a wafer stepper; (4) developing the resist so as to selectively remove resist and thereby pattern it using a tool such as a wet bench; (5) transferring the resist pattern into an underlying film or work piece by using a dry or plasma-assisted etching tool; and (6) removing the resist using a tool such as an RF or microwave plasma resist stripper.

What is claimed is:

1. A method of plating copper into damascene features, comprising:
   receiving a substrate having a seed layer with an average thickness of about 200 nanometers or less;
   electrically biasing the substrate while immersing the substrate in an aqueous low copper acid-containing electrolyte consisting essentially of:
   (i) water,
   (ii) a copper salt providing between about 4-10 grams per liter copper cations,
   (iii) acid at a concentration of between about 2-15 grams per liter,
   (iv) a source of halide ions,
   (v) at least one suppressor compound, and
   (vi) at least one accelerator compound,
   whereby the aqueous low copper acid-containing electrolyte induces a cathodic overpotential on the seed layer sufficient to protect the seed layer from dissolution by acid in the electrolyte during immersion;
   electroplating copper in the aqueous low copper acid-containing electrolyte, the electroplating process comprising:
   (a) a first plating phase to fill the features with copper, wherein a first current density during the first plating phase is between about 0.5-5 mA/cm$^2$, and
   (b) a second plating phase to deposit an overburden layer of copper on the substrate, wherein a second current density during the second plating phase is between about 10-15 mA/cm$^2$, and wherein the first and second plating phases are part of a single electroplating process; and
   removing the substrate from the electrolyte.

2. The method of claim 1, wherein the acid concentration is about 5-10 grams per liter.

3. The method of claim 1, wherein the suppressor compound is a polymeric compound.

4. The method of claim 1, wherein a concentration of accelerator compound is less than about 20 milligrams per liter.

5. The method of claim 1, wherein the copper salt provides less than about 5 grams per liter copper cations.

6. The method of claim 1, wherein the source of halide ions provides between about 10-150 milligrams per liter halide ions.

7. The method of claim 1, wherein the substrate has at least some features with openings smaller than about 20 nanometers.

8. The method of claim 1, wherein immersing the substrate comprises immersing the substrate at an angle relative to the surface of the electrolyte and then orienting the substrate horizontally.

9. The method of claim 1, further comprising:
   performing a post-plating treatment on the substrate.

10. The method of claim 9, wherein the post-plating treatment comprises rinsing the substrate.

11. The method of claim 9, wherein the post-plating treatment comprises planarizing the substrate.

12. The method of claim 1, wherein the pH of the electrolyte is between about 0.2 and 2.

13. The method of claim 1, wherein the substrate is a 450 mm semiconductor wafer.

14. The method of claim 1, wherein the electrolyte has a cloud point of about 50° C. or higher, and wherein the electrolyte is maintained at a temperature at least about 20° C. below the cloud point of the electrolyte during electroplating.

15. The method of claim 1, wherein the overburden layer of copper forms a continuous layer of copper that physically connects adjacent features to one another via the continuous layer of copper.

* * * * *